(12) United States Patent
Yang et al.

(10) Patent No.: US 9,345,123 B2
(45) Date of Patent: May 17, 2016

(54) METHOD OF MANUFACTURING A PLANARIZING PRINTED ELECTRONIC DEVICE

(71) Applicant: Electronics and Telecommunications Research Institute, Daejeon (KR)

(72) Inventors: Yong Suk Yang, Daejeon (KR); In-Kyu You, Daejeon (KR); Minseok Kim, Chungcheongbuk-do (KR); Soon-Won Jung, Daejeon (KR); Bock Soon Na, Daejeon (KR); Sang Chul Lim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 223 days.

(21) Appl. No.: 13/934,635

(22) Filed: Jul. 3, 2013

(65) Prior Publication Data
US 2014/0076610 A1    Mar. 20, 2014

(30) Foreign Application Priority Data

Sep. 20, 2012   (KR) .......................... 10-2012-0104493

(51) Int. Cl.
*H05K 3/02*    (2006.01)
*H05K 3/10*    (2006.01)
(Continued)

(52) U.S. Cl.
CPC ................ *H05K 1/02* (2013.01); *H01L 51/003* (2013.01); *H01L 51/0022* (2013.01); *H05K 3/0058* (2013.01); *H05K 3/207* (2013.01);
(Continued)

(58) Field of Classification Search
CPC ............ H05K 3/0058; G02F 1/133305; Y10T 156/10; Y10T 428/24545; Y10T 428/31938
USPC ................... 29/846, 830, 831, 844, 852, 884; 428/40.9, 345, 352, 458, 523, 901; 438/613, 690, 758, 761
See application file for complete search history.

(56) References Cited

U.S. PATENT DOCUMENTS

| | | | | |
|---|---|---|---|---|
| 5,948,526 A * | 9/1999 | Wilheim | ................. | B32B 15/08 428/345 |
| 6,884,709 B2 * | 4/2005 | Iijima | ................. | H05K 3/4038 438/613 |

FOREIGN PATENT DOCUMENTS

| | | |
|---|---|---|
| JP | 2005-276522 A | 10/2005 |
| KR | 10-0776685 B1 | 11/2007 |

(Continued)

*Primary Examiner* — Thiem Phan
(74) *Attorney, Agent, or Firm* — Rabin & Berdo, P.C.

(57) ABSTRACT

A method for manufacturing a planarized printed electronic device includes performing a surface treatment on a base substrate to provide a surface treated base substrate and facilitate release during a delamination process; printing a layer having an electrode pattern onto the surface-treated base substrate; forming an organic material layer comprised of an organic material on the base substrate on which the printed layer is printed such that the printed layer is embedded therein to provide an embedded layer; providing a target substrate onto which the embedded layer is to be transferred; laminating by sandwiching the embedded layer between the base substrate on which the embedded layer is formed and the target substrate; delaminating by detaching the embedded layer from the base substrate; and transferring the printed layer onto the target substrate to provide a planarized printed layer. Large areas with reduced defects due to surface roughness are possible.

6 Claims, 12 Drawing Sheets

(51) Int. Cl.
H05K 1/02 (2006.01)
H05K 3/00 (2006.01)
H05K 3/20 (2006.01)
H01L 51/00 (2006.01)
H05K 1/03 (2006.01)
H01L 51/10 (2006.01)
H01L 51/44 (2006.01)
H01L 51/52 (2006.01)

(52) U.S. Cl.
CPC ............ H01L 51/102 (2013.01); H01L 51/441 (2013.01); H01L 51/5203 (2013.01); H05K 1/0393 (2013.01); H05K 2201/0376 (2013.01)

(56) References Cited

FOREIGN PATENT DOCUMENTS

KR 10-2009-0114033 A 11/2009
KR 10-2011-0028861 A 3/2011
KR 10-2011-0138478 A 12/2011

* cited by examiner (a) Base Substrate Loading
(b) Surface Preparation
(c) Printing & Annealing
(d) Assembly Adhesive/ Printed glass
(e) Target Substrate Loading & Lamination
(f) Delamination & Transfer
(g) Target Substrate Unloading
(h) Autoclave & Next Process

METHOD OF MANUFACTURING A PLANARIZING PRINTED ELECTRONIC DEVICE

CROSS-REFERENCE TO RELATED APPLICATIONS

This application is based on and claims priority from Korean Patent Application No. 10-2012-0104493, filed on Sep. 20, 2012, with the Korean Intellectual Property Office, the disclosure of which is incorporated herein in its entirety by reference.

TECHNICAL FIELD

The present disclosure relates to a planarizing printed electronic device and a method for manufacturing the same, and more particularly, to a planarizing printed electronic device and a method for manufacturing the same by implementing a large-area printed electronic device by a simple method using a printing process and a transferring process when an embedded printed electronic device where a printed layer is embedded in a substrate is manufactured and particularly, solving a defect due to large surface roughness and thickness of the printed layer included in the printed electronic device.

BACKGROUND

Printed electronics which have been recently researched a lot means manufacturing electronic devices and components or modules through a printing technique. That is, electronic products having desired functions are manufactured by printing conductive or functional ink on a substrate such as plastic, papers, glass, and silicon.

The printed electronic process is easy to apply a method (roll-to-roll, R2R) of performing printing while winding a flexible material such as a film around a rotating roll. Since the printed electronic process is suitable for a large area and high-speed mass production, production costs may be reduced up to $1/10$ as compared with an existing process, and the printed electronic process has an eco-friendly characteristic because a use amount of materials wasted in an existing silicon-based process or toxic materials, energy consumption, and the like may be largely reduced.

A representative printed electronic technique includes an inkjet printing method, a gravure printing method, a screen printing method, and the like.

Among them, the inkjet printing method is a process technique of ejecting minute ink drops (having a diameter of 30 μm or less) from a head to pattern the ejected ink drops at a desired position. This technique is known as a process technique suitable for implementing a complicated shape in a small volume by a contactless method, and a basic technique has been developed as a printing technique of papers, and has been remarkably developed lately enough to perform high resolution printing. Application fields of the technique have been largely expanded from computers in offices and home to commercial printing, industrial printing, display or electronic circuit fields, and bio fields such as DNA chips.

The inkjet printing method has advantages in that a process is simple, and equipment costs and manufacturing costs may be reduced. Since the material is deposited at a desired pattern position, in principle, there is no loss of the material, and as a result, there is no waste of raw materials and an environmental load is small. Since a process such as developing and etching is not required like photolithography, properties of substrates or materials are not deteriorated by a chemical effect, and a device is not damaged due to a contact because of a contactless printing method, and patterns may be formed on a substrate having unevenness. In the case of printing by a drop on demand (DOD) method, a pattern shape may be directly edited and modified by a computer. On the contrary, the inkjet printing method has a disadvantage in that a printing speed is low because the patterns are formed in sequence. As a result, for a high-speed printing of LCD color filters, LCD companies such as Sharp Corporation, Samsung Electronics Co., Ltd. and LG Philips-LCD have developed multi-nozzles, high density of nozzles, high frequency of driving frequency, and the like.

The gravure printing method, as a kind of printing method using an intaglio, is a method of transferring ink put in a concave portion to a printed matter, after coating the ink on a cylindrical plate having unevenness to scrape the ink coated on a convex portion. In a conventional method, after photo-sensitivity is applied to a surface of a cylinder, a plate is made by overlapping and engraving a gravure screen and a transparent positive and performing etching with a ferric chloride solution. Since the surface of the plate is constituted by minute half-tone dots divided by a screen line to be deeply etched in proportion to the concentration of an etching solution, grays of a minute pattern may be reproduced to be widely used for printing of magazines or catalog pictures. Since the printing concentration is determined by a depth and density of minute pores, a coating thickness is easily controlled and the method is effective when the device is manufactured. A gravure offset printing method of coupling the printing method and an offset printing method has been recently applied for wirings of displays of LCD color filters and electronic circuits. The gravure offset printing method is an offset printing method of performing printing by transferring ink from a printed plate to a rubber blanket and transferring the ink of the blanket to the substrate again and a printing method of replacing a printed plate of the offset printing method with a printed plate used in the gravure printing method. Japanese companies such as Dai-Nippon Print or Toppan Print had discussed the gravure printing as an important manufacturing process of a flexible organic electronic device together with a screen printing method, and particularly, had expected that the gravure printing is useful to manufacture a minute printed electronic device of several μm or less.

The screen printing method is illustrated in FIG. 3 as a process of loading an ink paste on a screen pulled by strong tension and pressing and moving a squeegee to push and transfer the paste to the surface of the printed matter through a mesh of the screen. Similarly to the inkjet printing method, as an additive process having a small loss of the material, researches for manufacturing displays such as an active matrix organic light emitting diode (AMOLED) are being conducted. The screen originally uses fabrics such as silk, but a mesh material for minute patterning is changed to stainless steel, and the used paste is used by dispersing a resin or solvent in a basic material such as metal powder or semiconductor because proper viscosity is required. Although the screen printing method is a contact printing method in which the screen contacts the substrate to transfer the paste while a distance of several mm is maintained between the screen and the substrate and then the squeegee passes between the screen and the substrate, there is no effect of the substrate through contact.

A market of printed electronics is still in its early stages, but is expected to be rapidly expanded in accordance with the development of material and process techniques and advanced demands, and the printed electronics have potential capable of causing a revolution in almost all fields in which semiconductors such as RFID tags, illuminations, displays, solar batteries, batteries, or devices, circuits, and the like are used. A high-performance integrated circuit has also possibility to replace an existing silicon-based product. Famous enterprises in related industries field such as electronics, chemistry, and printing are promoting development and commercialization, and widespread applications are possible up to security services, packaging and distribution, environment/energy, healthcare industries in addition to an electronic industry.

However, the printed electronic technique in the related art has shortcomings and limitations, and among them, a lack of performance and integration is the most remarkable. Due to the limitations of material and process techniques, a thickness of a thin film is large, a surface state is bad, and performance and integration are inferior as compared with existing electronic devices or manufacturing methods. There is a problem in that durability is relatively low because organic printing materials have low durability as compared with existing inorganic materials, and therefore research and development (R&D) for inking of high-performance inorganic materials and performance improvement of organic materials is required.

SUMMARY

The present disclosure has been made in an effort to provide a method for manufacturing a planarizing printed electronic device and a planarizing printed electronic device manufactured by using the same by simply implementing a large-area printed electronic device by coupling a printing process such as inkjet printing and gravure printing and a transferring process using a laminating device and particularly, solving defects due to large surface roughness and thickness of a printed layer included in the printed electronic device.

An exemplary embodiment of the present disclosure provides a method for manufacturing a planarizing printed electronic device, including: printing a layer including an electrode pattern on a base substrate; forming an organic material layer on the base substrate with the printed layer such that the printed layer is embeded; stacking and laminating a target substrate in which the printed layer on the organic material embedded layer is transferred; and planarizing the printed layer on the target substrate by detaching the organic material embedded layer and the printed layer from the base substrate through a delamination process on the target substrate and then transferring the printed layer to the target substrate.

The method for manufacturing a planarizing printed electronic device may further include performing a surface treatment on the base substrate or forming a surface layer, before printing the layer on the base substrate.

In the stacking and laminating of the target substrate, coating an adhesive for lamination on the target substrate, and laminating a coated target substrate with the organic material embedded layer so that the coated target substrate is attached onto the base substrate.

In the lamination process, pressure and heat may be applied onto the target substrate by using a roller for lamination at 60° C. to 100° C.

In the forming of the organic material embedded layer, a polymer insulating layer may be formed by using polymer ink including polyacrylate, polyimide (PI), polyurethane, polyethylene, poly(methyl methacrylate) (PMMA), poly(vinyl phenol) (PVP), and polyvinyl alcohol (PVA).

Another exemplary embodiment of the present disclosure provides a planarizing printed electronic device, including: a target substrate; an organic material embedded layer transferred onto the target substrate through a delamination process; and a printed layer embedded in the organic material embedded layer and formed flatly without forming a step with an upper side of the organic material embedded layer.

According to the exemplary embodiments of the present disclosure, it is possible to increase productivity by implementing a large-area printed electronic device by a simple method by grafting a printing process and a transferring process when an embedded printed electronic device including a printed layer embedded in a substrate is manufactured. It is possible to increase reliability of products by resolving defects due to large surface roughness and a large thickness of the printed layer included in a printed electronic device in the related art and planarizing the printed layer.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1A:
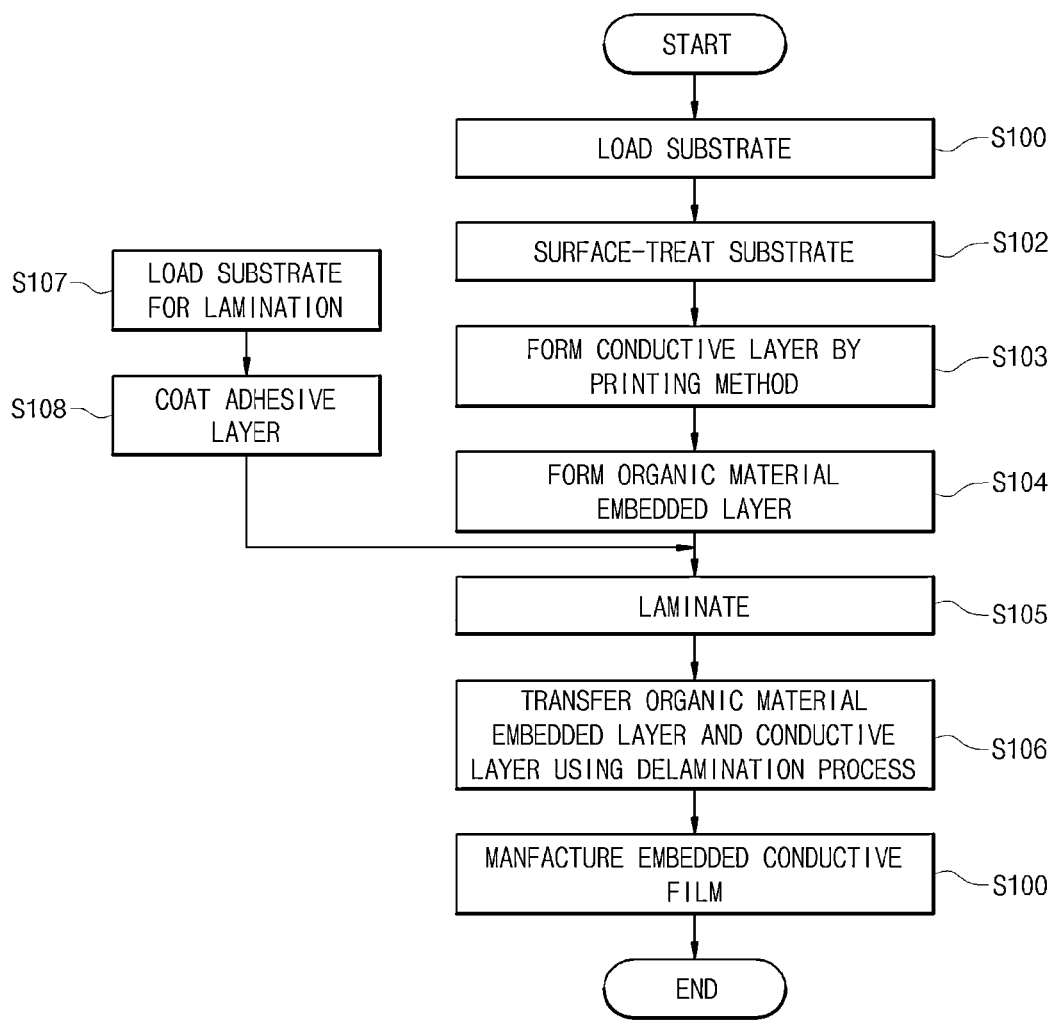
FIG. 1A is a process flowchart for describing a method for manufacturing a planarizing printed electronic device according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Hereinafter, exemplary embodiments of the present disclosure will be described in detail with reference to the accompanying drawings. Hereinafter, a configuration and an acting effect of exemplary embodiments of the present disclosure will be clearly understood through the following detailed description. Prior to the detailed description of the exemplary embodiments of the present disclosure, it is to be noted that like reference numerals refer to like elements even though like elements are shown in different drawings and well-known functions or constructions will not be described in detail since they may unnecessarily obscure the understanding of the present disclosure.

Recently, in order to improve a thickness and surface roughness of a thin film for a printed electronic device, researches of complementing the thickness and the surface roughness by embedding the printed thin film by an insulating structure have been conducted. Representatively, Korean Patent Application No. 10-2009-0086482 applied by Samsung Electro-mechanics Co., Ltd., discloses a method for manufacturing an embedded wiring pattern during manufacturing of a printed circuit board including forming an insulating structure having unevenness on a copper-foil stacked plate, forming a metal film covering the insulating structure while embedding the unevenness, and etching and planarizing the metal film by a reverse current electroplating process having a process condition in which the density of reverse current is larger than the density of constant current.

As another research, SiPiX Imaging Corporation discloses, in order to manufacture an electronic paper which may be applied to a mass production process of R2R (printing method by a rotating roll), a method of implementing a planarizing printed pattern by using a high-speed microembossing technique, an ink filling process, a sealing process.

Figure 1B:
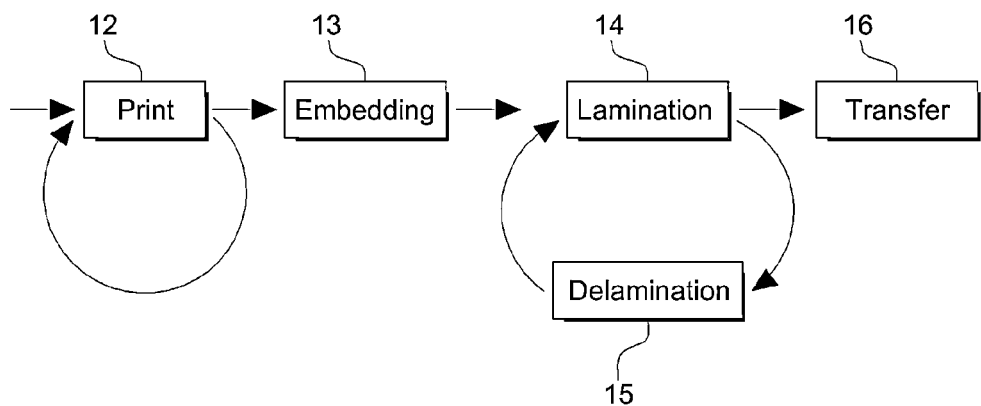
FIG. 1B is a diagram schematically illustrating the manufacturing method exemplified in FIG. 1A.

The present disclosure suggests a method for simply manufacturing an embedded printed electronic device by combining a printing process and a transferring process using a lamination device without performing etching or planarizing, or using the ink filling process and the like, in order to implement the planarizing printed pattern like the research results FIG. 1A is a process flowchart for describing a method for manufacturing a planarizing printed electronic device according to an exemplary embodiment of the present disclosure, and FIG. 1B is a diagram schematically illustrating the manufacturing method exemplified in FIG. 1A.

A planarizing printed electronic device according to an exemplary embodiment of the present disclosure has a structure including a substrate (target substrate), an organic material embedded layer transferred on the substrate by a delaminating process, a printed pattern embedded on an upper side of the organic material embedded layer to be planarized with the organic material embedded layer, a lamination substrate formed on the printed pattern, and an adhesive layer required for adhering the lamination substrate during a lamination process.

A method for manufacturing the planarizing printed electronic device includes loading a substrate (S100), surface-treating the substrate (S101), forming a conductive layer having a printed pattern formed by a printing method 12 (S102), forming an organic material embedded layer for embedding 13 the conductive layer (S103), loading a lamination substrate (S107), coating an adhesive layer on the lamination substrate (S108), laminating 14 a printed substrate and the substrate coated with the adhesive layer (S104), transferring 16 the organic material embedded layer and the conductive layer (S105) by using a delamination process 15, and manufacturing an embedded conductive layer (S106).

Here, the conductive layer, as a layer with an electrode pattern formed by using a conductive ink material, includes a printed layer for a general electronic device. The conductive ink material uses a material formed by using a metal such as Al (4.1 to 4.3 eV), Cr (4.3 eV), Ag (4.4 eV), Cu (4.6 eV), Au (5.1 to 5.3 eV), Ni (5.2 eV), and Pt (5.7 eV), an oxide conductor such as ITO (4.8 to 5.0 eV), carbon nano tube (CNT, 4.7 to 4.9 eV), graphene (4.5 eV) which have a work function of about 4 eV to 6 eV, a conductive organic material, or a mixture thereof.

The surface-treating of the substrate (S101) is a process for controlling adhesion force between the conductive layer and the organic material embedded layer formed on the substrate by the printing method 12 and the substrate, in order to transfer the printed layer and the embedded layer well during the delamination 15.

For example, a polymer surface treatment using plasma or a frame is a simple method of increasing wettability and adhesion by introducing a polar functional group such as oxygen to a surface of hydrophobic polymer such as PE, PP, and PET. Since a contact angle of a waterdrop on the surface of a silicon oxide film or glass is generally decreased as a plasma treatment time is increased, various adhesive properties may be implemented according to a treatment degree. This is because the plasma causes a change in hydrophilic reformation of a surface layer of 0.5 to 50 nm while cleaning an organic material attached to the glass surface. On the contrary, a hydrophobic property of a surface state may be reinforced by using a self-assembled monolayer (SAM) having a functional group such as —$CH_3$.

Figure 2:
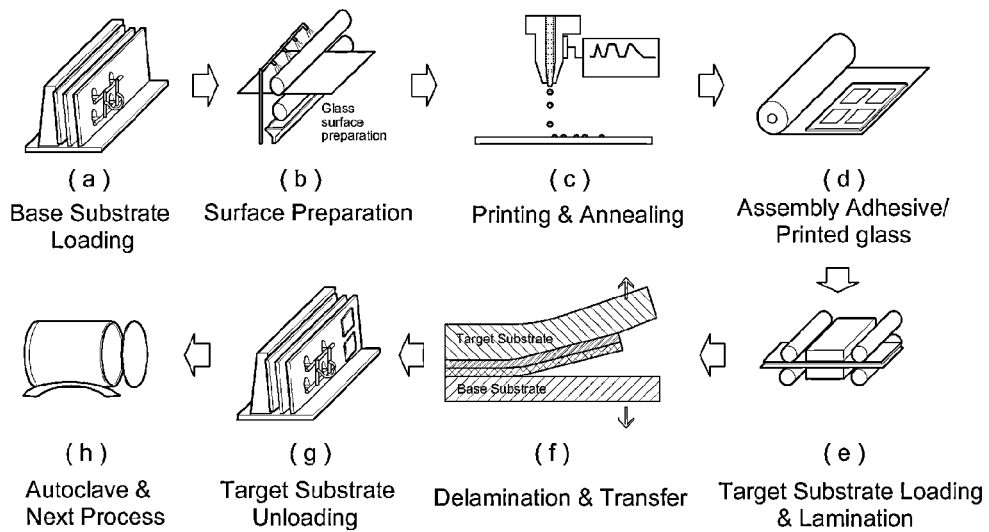
FIG. 2 is a diagram illustrating the method for manufacturing a planarizing printed electronic device according to the exemplary embodiment of the present disclosure for each process device.

FIG. 2 illustrates the manufacturing method exemplified in FIG. 1A for each process and each device.

First, the embedded conductive layer is sequentially manufactured by loading a substrate ((a) base substrate loading), surface-treating the substrate ((b) surface preparation), forming a conductive layer by a printing method such as inkjet printing or gravure printing and an annealing method ((c) printing and annealing), forming an organic material embedded layer, loading a substrate for lamination, coating an adhesive layer on the substrate for lamination ((d) assembly adhesive/printed glass), laminating a printed substrate and the substrate coated with the adhesive layer ((e) target substrate loading & lamination), transferring the organic material embedded layer and the conductive layer by using a delamination process ((f) delamination & transfer), unloading the substrate ((g) substrate unloading), and cutting the substrate in a required state.

Then, a process of manufacturing the planarizing printed electronic device for each process step by using the manufacturing method will be described in detail with reference to FIGS. 3A to 3G.

For reference, the process will be described in connection with the manufacturing steps of FIG. 1A.

Figure 3A:
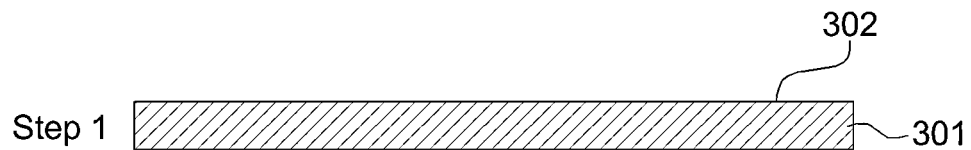
FIGS. 3A to 3G are cross-sectional flowcharts illustrating the method for manufacturing a planarizing printed electronic device according to the exemplary embodiment of the present disclosure for each process step.

First, referring to FIG. 3A, a base substrate 301 for printing is loaded (S100), and a surface treatment is performed or a surface layer 302 is formed on the substrate 301 (S101).

The surface treatment process is a surface treatment in order that the printed layer and the organic material embedded layer on the substrate 301 are detached from the substrate 301 during the transferring process to be moved well to another substrate, and as a result, a printed pattern having an accurate shape may be implemented and the printed pattern may be clearly transferred during the delamination process.

In the case of forming a separate surface layer 302, a thin film serving as a sacrificial layer is formed, and the surface layer also serves to clearly transfer the printed pattern during the delamination process. A representative sacrificial layer is photoresist (PR)-based polymer and removed by using a proper solvent or remover after the delamination.

Figure 3B:
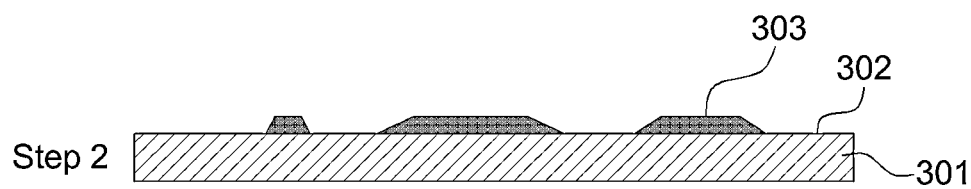

Next, as illustrated in FIG. 3B, a printed layer 303 is formed on the surface-treated substrate 301 by using a printing method such as an inkjet printing method and a gravure printing method (S102). Solvents or other organic materials in the ink are removed by annealing at a proper temperature after printing.

Figure 3C:
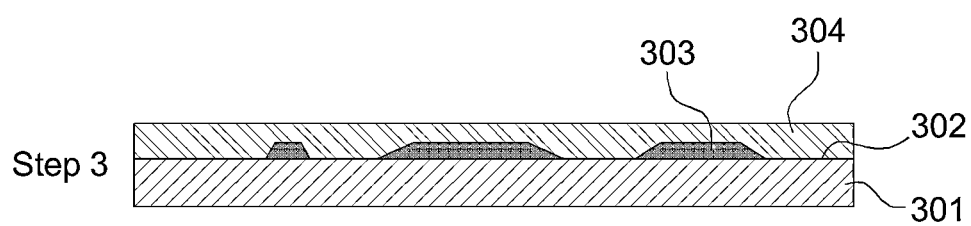

Thereafter, as illustrated in FIG. 3C, an organic material embedded layer 304 is formed on the substrate 301 with the printed layer 303 (S103).

The organic material embedded layer 304, as an insulating layer for embedding the printed layer 303, may use polymer ink including polyacrylate, polyimide (PI), polyurethane, polyethylene, poly(methyl methacrylate) (PMMA), poly(vinyl phenol) (PVP), and polyvinyl alcohol (PVA), and the like.

A method of forming the organic material embedded layer 304 includes both a wet process such as spin coating, dip coating, and doctor blade coating and a dry process such as parlylene coating.

Figure 3D:
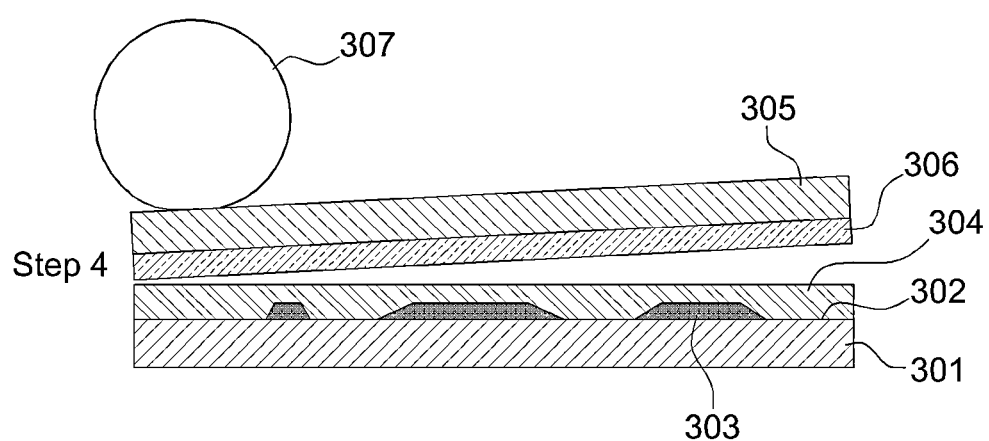

Thereafter, as illustrated in FIG. 3D, a target substrate 305 to be transferred is laminated on the substrate 301 with the organic material embedded layer 304, and an adhesive 306 is coated and prepared on the target substrate 305 in advance in order to increase adhesion force (S107 and S108).

The adhesive 306 is directly coated in a liquid state or a both-sided adhesive film may be coated on the surface of the target substrate 305, and a film having a thermal release tape shape may be coated. Here, the thermal release tape has adhesion force like a general adhesive tape, but has a characteristic capable of controlling an adhesion state through the annealing process because of a characteristic released at a predetermined temperature, for example, 80° C. to 120° C.

In FIG. 3D, a roller for lamination 307 is in a preparing state for post-process lamination.

Figure 3E:
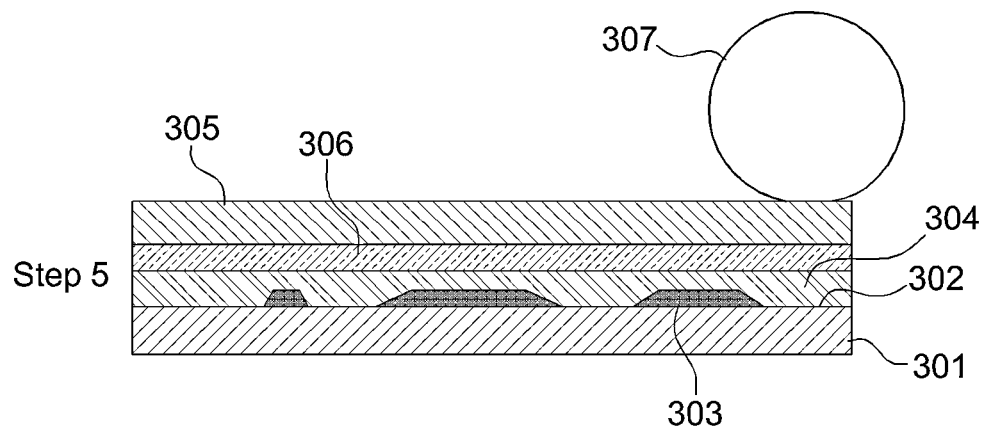

Next, referring to FIG. 3E, as the lamination step, while the roller for lamination 307 rotates in a state where the target substrate 305 is loaded on the substrate 301, the substrate 301 with the organic material embedded layer 304 and the target substrate 305 are attached to each other (S104).

The roller for lamination 307 serves to apply heat of 60° C. to 100° C. and pressure during the lamination.

Figure 3F:
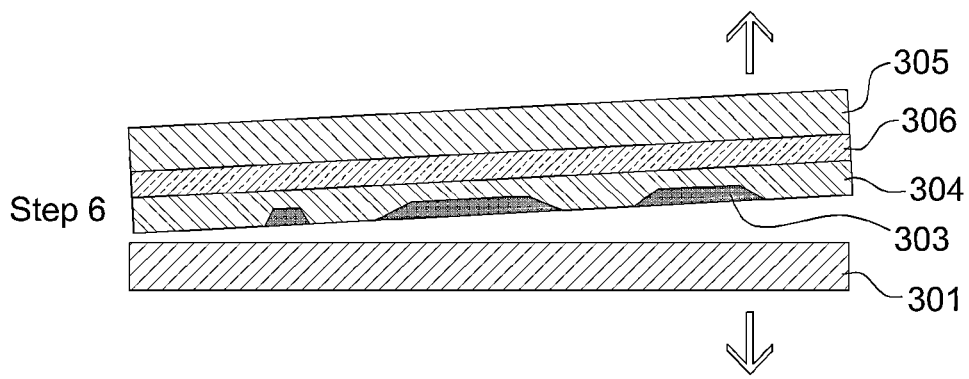

Thereafter, as illustrated in FIG. 3F, the substrate 301 and the target substrate 305 are detached from each other by the delamination process, and simultaneously, the organic material embedded layer 304 and the printed layer 303 on the substrate 301 are separated from each other to be transferred to the target substrate 305 (S105).

The transferred printed layer 303 has a flat surface without a step with the organic material embedded layer 304.

Figure 3G:
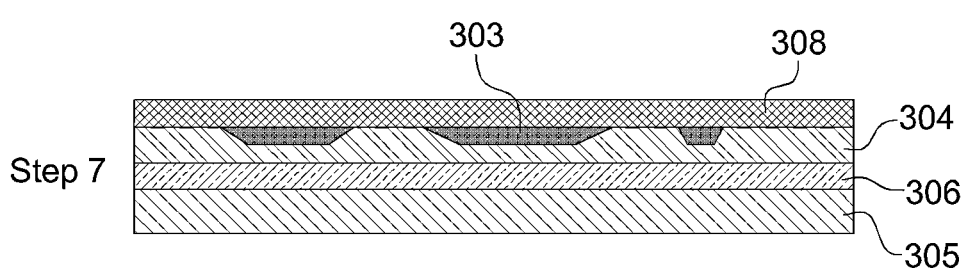

Thereafter, as illustrated in FIG. 3G, a second printed layer 308 is formed on the organic material embedded layer 304 transferred onto the target substrate 305. The second printed layer 308 is referred to as a thin film layer, and for example, the second printed layer 308 may be added by a process of manufacturing a large-area electrode by depositing an ITO thin film or coating a conductive organic thin film, in order to use the printed layer 303 transferred onto the target substrate 305 as a metal auxiliary electrode. As another example, the second printed layer 308 may be added by a process of manufacturing a top gate type transistor on a planarized channel by loading a semiconductor material (second printed layer) on the printed layer 303 in which metal printed patterns of a source and a drain are formed.

Through the process, the present disclosure may manufacture the planarizing printed electronic device in which the printed layer 303 embedded in the organic material embedded layer 304 does not form a step with the organic material embedded layer 304 transferred onto the target substrate 305 and is formed flatly with the upper side of the organic material embedded layer 304. In this case, the planarizing printed electronic device may further include an adhesive layer in which an adhesive is coated or an adhesive film is inserted between the target substrate 305 and the organic material embedded layer 304.

Figure 4:
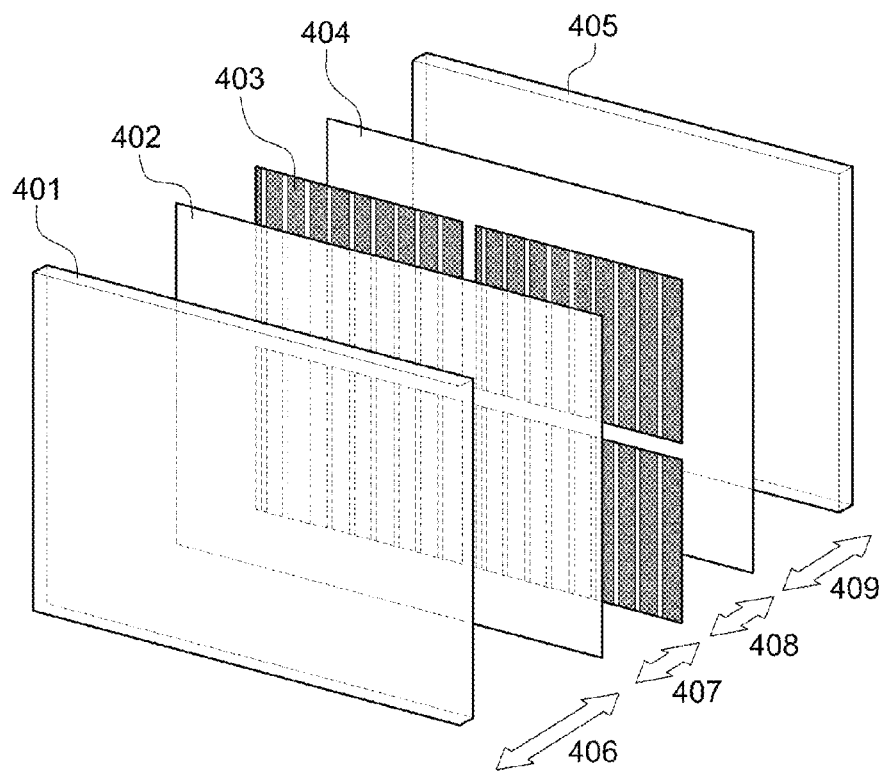
FIG. 4 is a diagram illustrating the degree of adhesion force shown between layers in FIG. 3F.

FIG. 4 is a diagram illustrating the degree of adhesion force between layers in FIG. 3F.

The printed electronic device according to the exemplary embodiment of the present disclosure includes a base substrate 401, a surface layer 402, a printed pattern 403, and an organic material embedded layer 404, and a target substrate 405. In this structure, adhesion force 408 between the printed pattern 403 and the organic material embedded layer 404 and adhesion force 409 between the organic material embedded layer 404 and the target substrate 405 are so strong that they are not separated from each other during the delamination process. Adhesion force 406 between the base substrate 401 and the surface layer 402 and adhesion force 407 between the surface layer 402 and the printed pattern 403 are relatively weak so that they are easily separated from each other in the delamination process. Accordingly, during the transferring process by the delamination process, the organic material embedded layer 404 and the printed pattern 403 are detached from the base substrate 401 to be transferred to the target substrate 405.

EXAMPLE 1

In Example 1, the following devices and processes were used in order to manufacture the planarizing printed electronic device.

Glass having a thickness of 300 μm as a base substrate, oxygen plasma treatment as a surface treatment process, and a contactless drop-on-demand (DoD) printing method such as inkjet printing for forming a printed pattern were applied. Inkjet printing was performed by using organic silver complexes of Ag ink or Ag ink containing Ag nano particles (viscosity of ink is about 10 cPs), and an annealing process was performed on the inkjet-printed substrate for 30 minutes at 150° C., and then a printed layer was formed thereon. A detailed description for the Ag ink and the inkjet printing thereof was disclosed in Korean Patent Application No. 10-2009-0101136.

Figure 5:
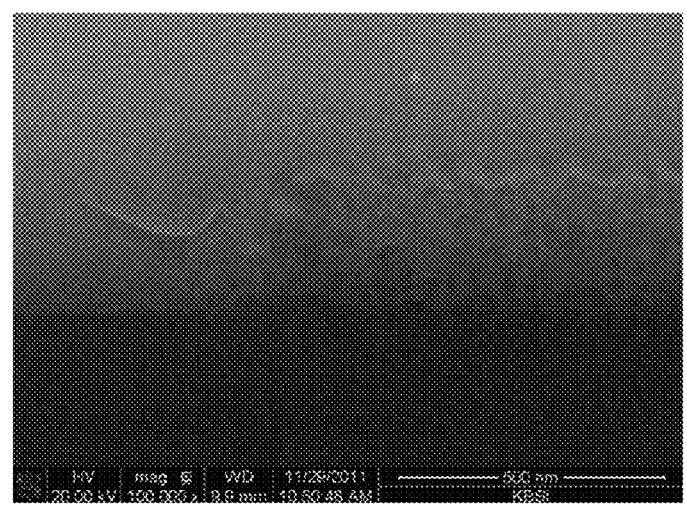
FIG. 5 is a focus ion beam-scanning electronic microscope (FIB-SEM) cross-sectional photograph of an Ag metal thin film manufactured on glass by an inkjet printing method according to Example 1 of the present disclosure.

According to Example 1, an Ag metal thin film formed on the glass substrate by inkjet printing was observed through a focused ion beam-scanning electron microscopy (FIB-SEM). As a result, as illustrated in FIG. 5, the Ag metal thin film had a thickness of about 250 nm and a rough surface. Here, a Pt thin film was auxiliarily deposited in order to cut a cross section.

An organic material embedded layer was deposited with parylene polymer by using a dry process of chemical vapor condensation (CVC). For the deposition of parylene, a powder-shaped parylene dimer was used as an initial material. First, the parylene dimer powder was put in a vaporizer and heated at a temperature of 105° C. or more (preferably, about 150° C.) under a vacuum of 10 to 100 mtorr, and as a result, the parylene dimer was not melted, but sublimated in a gas state. The gas passed through a pyrolysis unit of 650° C. to be pyrolyzed into parylene monomers, and finally, a parylene polymer film was grown through condensation and diffusion of the monomers in a deposition chamber at a room temperature or less and reaction of an end of a free radical and the monomers. When the substrate was left in the deposition chamber, the parylene polymer film having a desired thickness was manufactured. A detailed description for the deposition condition of the parylene polymer was disclosed in Korean Patent Application No. 10-2011-0023979.

Figure 6:
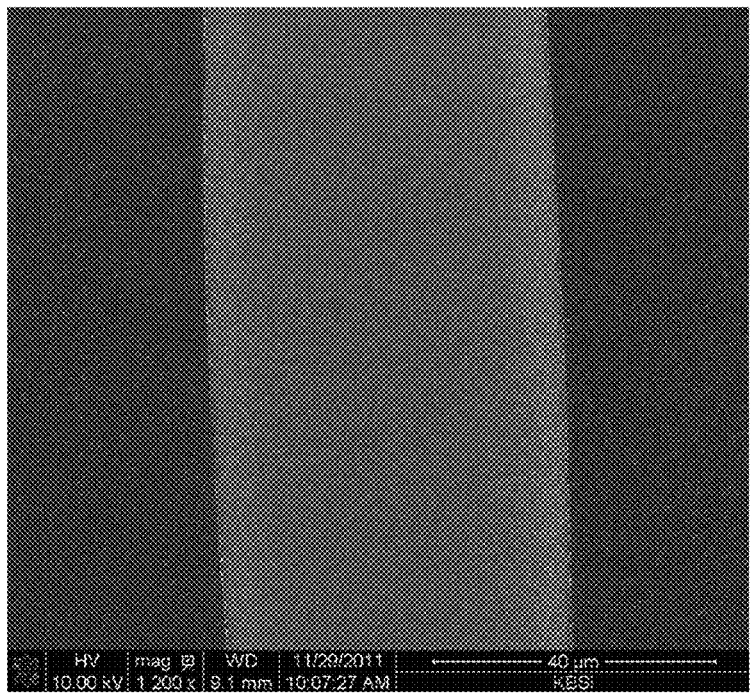
FIG. 6 is an SEM photograph of an Ag metal electrode transferred on a target substrate after performing a process by the manufacturing method according to Example 1 of the present disclosure.
Figure 7:
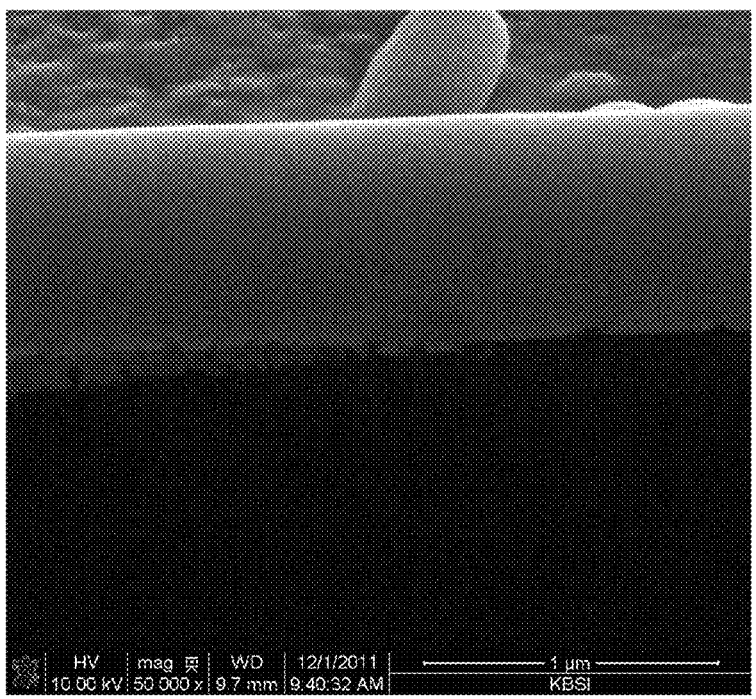
FIG. 7 is a focus ion beam-scanning electronic microscope (FIB-SEM) cross-sectional photograph of a boundary of the Ag metal electrode in FIG. 6.

After forming the organic material embedded layer and terminating the transferring process, the Ag metal electrode transferred onto the target substrate was observed by a scanning electronic microscope. FIG. 6 is a photograph of patterns of an Ag metal electrode observed by a scanning electronic microscope, and FIG. 7 is a focus ion beam-scanning electronic microscope (FIB-SEM) cross-sectional photograph observing a boundary of the Ag metal electrode in FIG. 6. As illustrated in FIGS. 6 and 7, the Ag metal electrode was formed to be embedded in the parylene polymer.

Figure 8A:
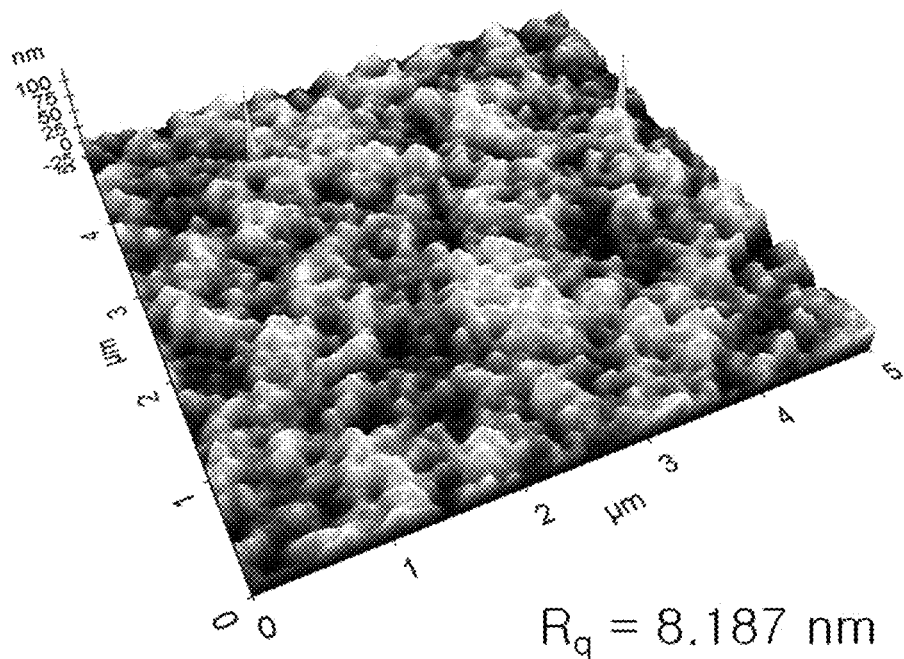
FIGS. 8A to 8B are diagrams illustrating atomic force microscope (AFM) surface photographs of a printed Ag metal electrode and an embedded Ag metal electrode by the manufacturing method according to Example 1 of the present disclosure, respectively.
Figure 8B:
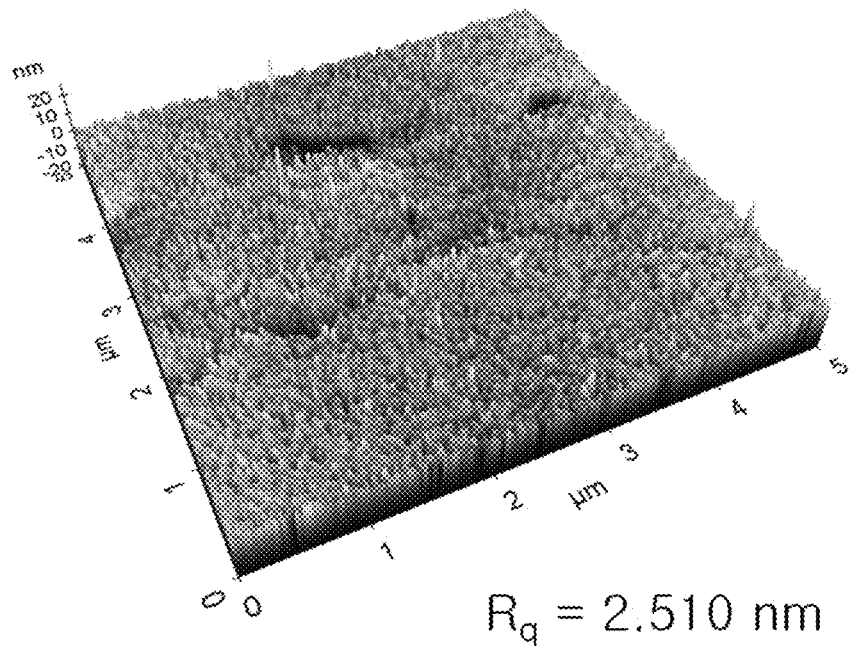

FIGS. 8A to 8B illustrate atomic force microscope (AFM) surface photographs of a printed Ag metal electrode and an embedded Ag metal electrode according to Example 1 of the present disclosure, respectively. The root-mean-squared roughness $R_q$ of the printed Ag metal electrode and the embedded Ag metal electrode was 8.187 nm and 2.510 nm, respectively, and the root-mean-squared roughness $R_q$ of the embedded Ag metal electrode was smaller than that of the printed Ag metal electrode.

Figure 9:
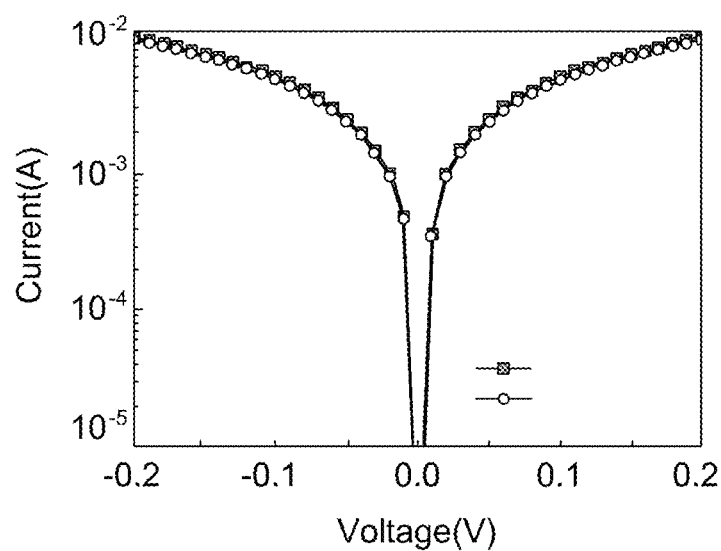
FIG. 9 is a graph comparing magnitudes of electrical conductivity measured in the printed Ag metal electrode and the embedded Ag metal electrode on a glass substrate.

FIG. 9 is a graph comparing magnitudes of electrical conductivity measured in the printed Ag metal electrode and the embedded Ag metal electrode on the glass substrate according to Example 1. The electric conductivity values of the printed Ag metal electrode and the embedded Ag metal electrode were 20.39 Ω and 21.03 Ω, respectively, and there was no difference therebetween.

As such, in the printed electronic device manufactured according to Example 1, it may be verified that a large thickness and large surface roughness of the printed layer in the printed electronic device may be resolved by grafting the inkjet printing process, the manufacturing process of the organic material embedded layer using parylene polymer, and the transferring process using the lamination device.

EXAMPLE 2

In Example 2, the following devices and processes were used in order to manufacture the planarizing printed electronic device.

A glass substrate having a thickness of 300 μm was used as a base substrate, and surface treatment was performed by using an oxygen plasma treatment process. In order to form a printed pattern, a contactless drop-on-demand (DoD) printing method such as inkjet printing was used. In this case, Ag ink was used, similarly to Example 1.

As the organic material embedded layer, a polymer insulating layer was formed by using polymer ink such as polyacrylate, polyimide (PI), polyurethane, polyethylene, poly(methyl methacrylate) (PMMA), poly(vinyl phenol) (PVP), and polyvinyl alcohol (PVA) and by a method such as spin coating, dip coating, and doctor blade coating. A component improving a coating property such as resin, an adhesive, or wax was added in the polymer ink, or a UV curable material may be added to a photo-reactive material. After coating the polymer using the wet process, the annealing process was performed for 30 minutes at 180° C. and a curing process was performed to complete the organic material embedded layer.

Figure 10:
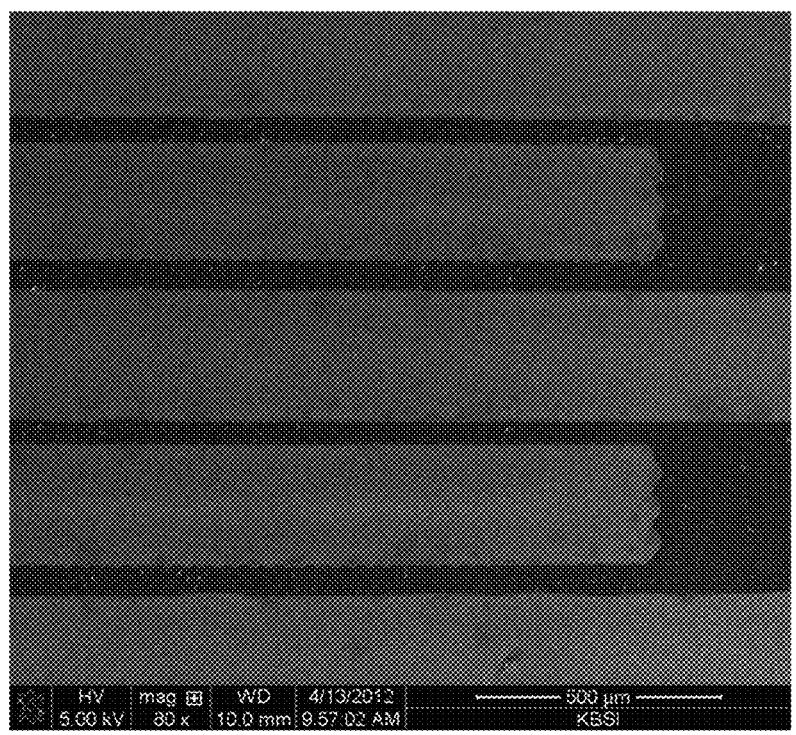
FIG. 10 is an SEM photograph of an Ag metal electrode transferred on a target substrate after performing a process by a manufacturing method according to Example 2 of the present disclosure.
Figure 11:
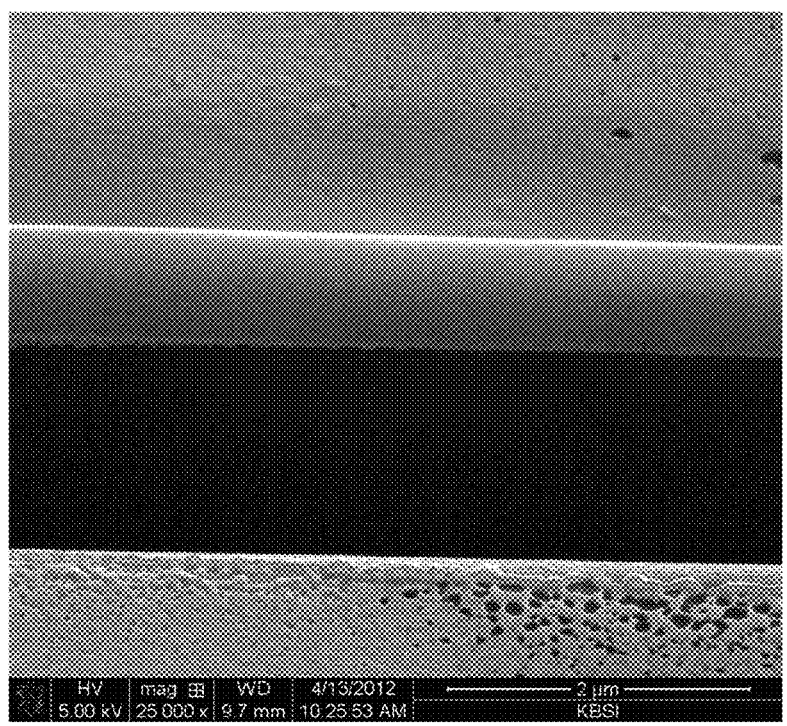
FIG. 11 is a focus ion beam-scanning electronic microscope (FIB-SEM) cross-sectional photograph of a boundary of the Ag metal electrode in FIG. 10.

FIG. 10 is an SEM photograph of Ag metal electrode patterns transferred on the target substrate after performing the process according to Example 2. FIG. 11 is a FIB-SEM cross-sectional photograph of a boundary of the Ag metal electrode in FIG. 10. The Ag metal electrode was observed in a form embedded in the polymer through the photograph.

Figure 12:
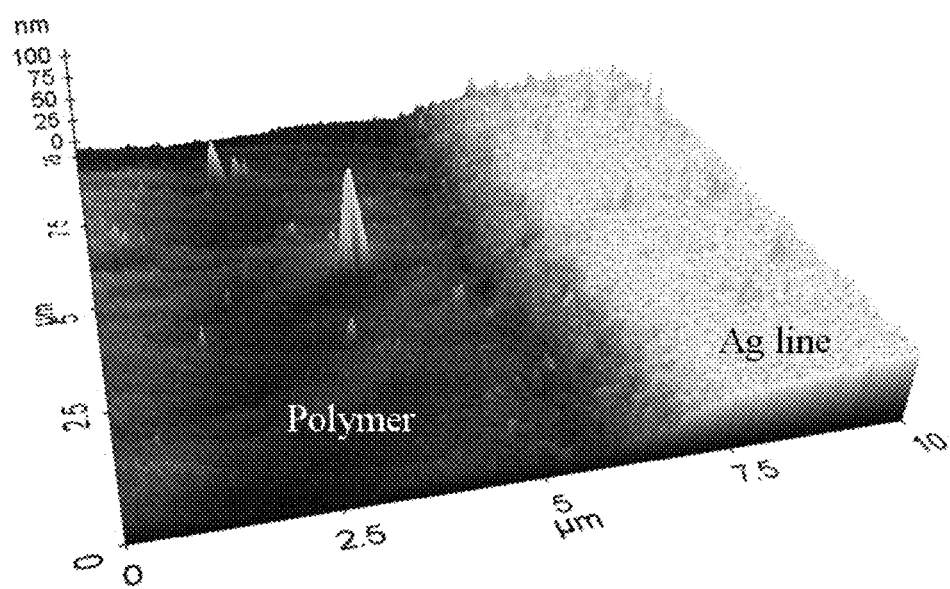
FIG. 12 is an atomic force microscope (AFM) cross-sectional photograph of a boundary of the Ag metal electrode in FIG. 10.
Figure 13A:
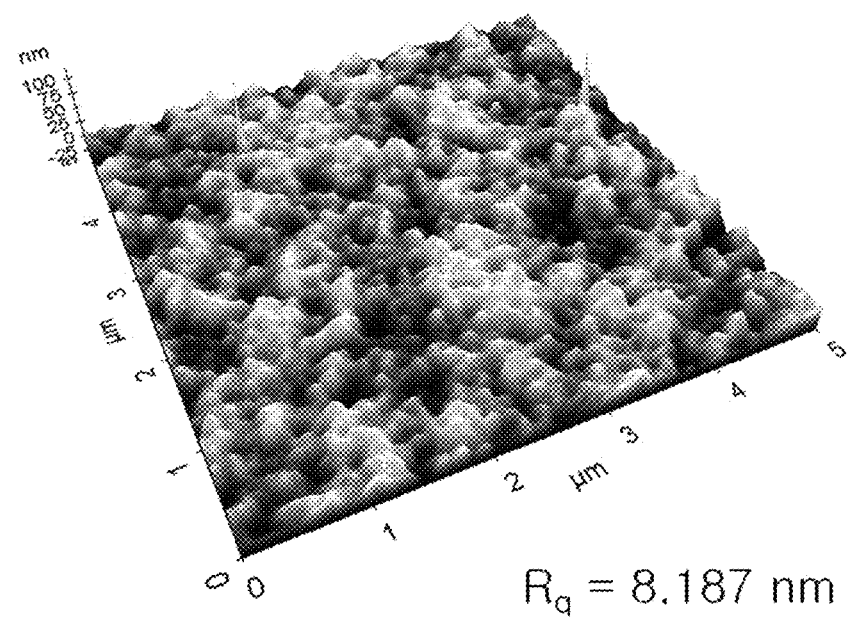
FIGS. 13A to 13B are atomic force microscope (AFM) surface photographs of a printed Ag metal electrode and an embedded Ag metal electrode by the manufacturing method according to Example 2 of the present disclosure, respectively.
Figure 13B:
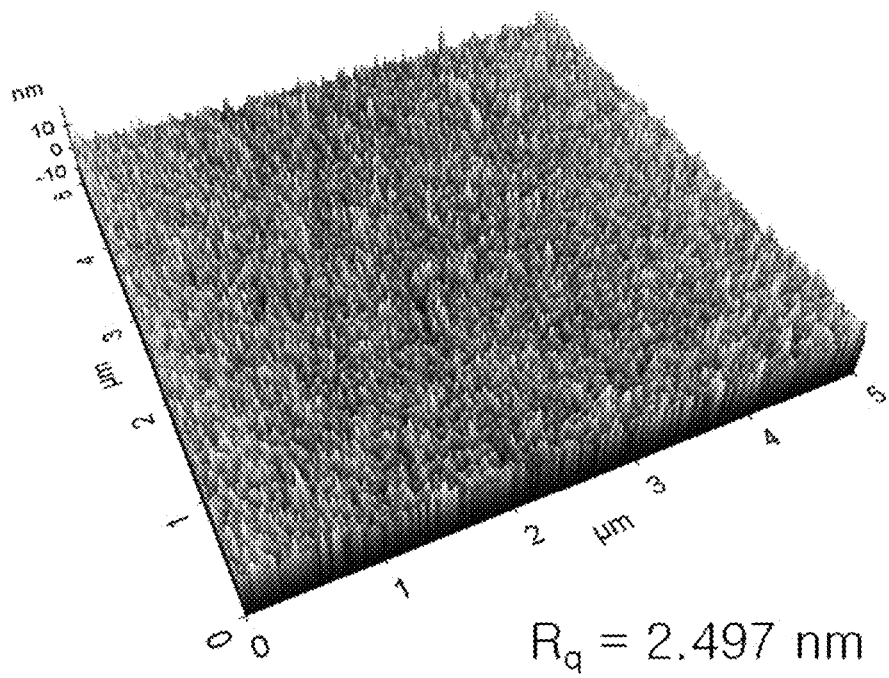

FIG. 12 is an AFM cross-sectional photograph of a boundary of the Ag metal electrode in FIG. 10, and FIGS. 13A to 13B illustrate atomic force microscope (AFM) surface photographs of the printed Ag metal electrode and the embedded Ag metal electrode according to Example 2, respectively. The root-mean-squared roughness $R_q$ of the printed Ag metal electrode and the embedded Ag metal electrode was 8.187 nm and 2.497 nm, respectively.

As such, in the planarizing printed electronic device manufactured according to Example 2, it may be verified that a large thickness and large surface roughness of the printed layer included in the printed electronic device may be resolved by grafting the inkjet printing process, the manufacturing process of the organic material embedded layer using wet polymer, and the transferring process using the lamination device.

EXAMPLE 3

In Example 3, the following devices and processes were used in order to manufacture the planarizing printed electronic device by combining a printing process and a transferring process using lamination.

A Si substrate having a thickness of 300 μm was used as a base substrate, and a contact printing method such as gravure printing was used in order to form a printed pattern. The gravure printing, as a kind of intaglio printing, is a method of transferring ink put in a concave portion to a printed matter, after coating the ink on a cylindrical plate having unevenness to scrape the ink coated on a convex portion. Gravure ink used Ag ink having viscosity of 5,000 to 20,000 cPs, and an annealing process was performed on the printed substrate for 30 minutes at 200° C. and then the printed layer was completed thereon.

As the organic material embedded layer, a polymer insulating layer was formed by using polymer ink such as polyacrylate, polyimide (PI), polyurethane, polyethylene, poly (methyl methacrylate) (PMMA), poly(vinyl phenol) (PVP), and polyvinyl alcohol (PVA) and by a method such as spin coating, dip coating, and doctor blade coating. A component improving a coating property such as resin, an adhesive, or wax was added in the polymer ink, or a UV curable material may be added to a photo-reactive material.

In Example 3, after coating the polymer using the wet process, the annealing process was performed for 30 minutes at 180° C. and a curing process was performed to complete the organic material embedded layer.

Figure 14:
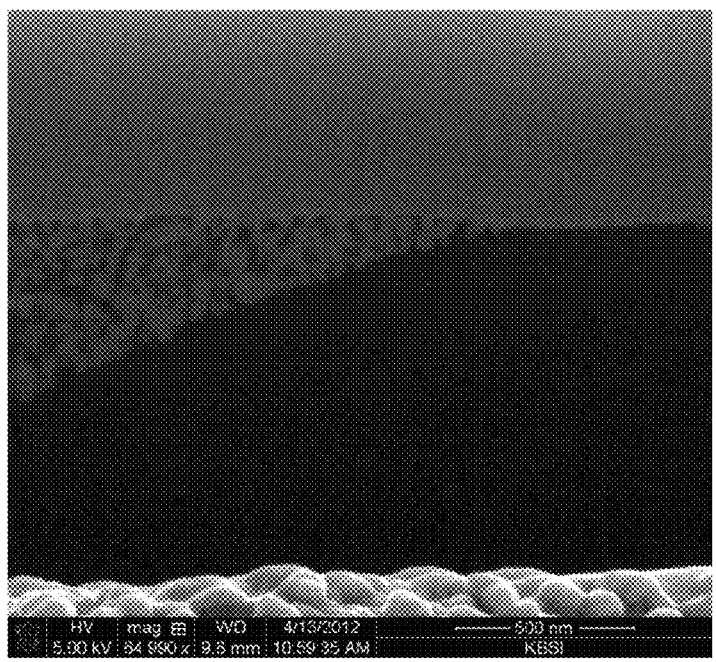
FIG. 14 is a focus ion beam-scanning electronic microscope (FIB-SEM) cross-sectional photograph for a boundary between an Ag metal electrode and a polymer embedded layer printed by a gravure printing method according to Example 3 of the present disclosure.

As a result of observing the boundary between the completed Ag metal electrode and polymer embedded layer through a focused ion beam-scanning electron microscopy (FIB-SEM), as illustrated in FIG. 14, it was observed that the Ag metal electrode thicker than an inkjet-printed sample was also embedded well in the polymer.

Figure 15:
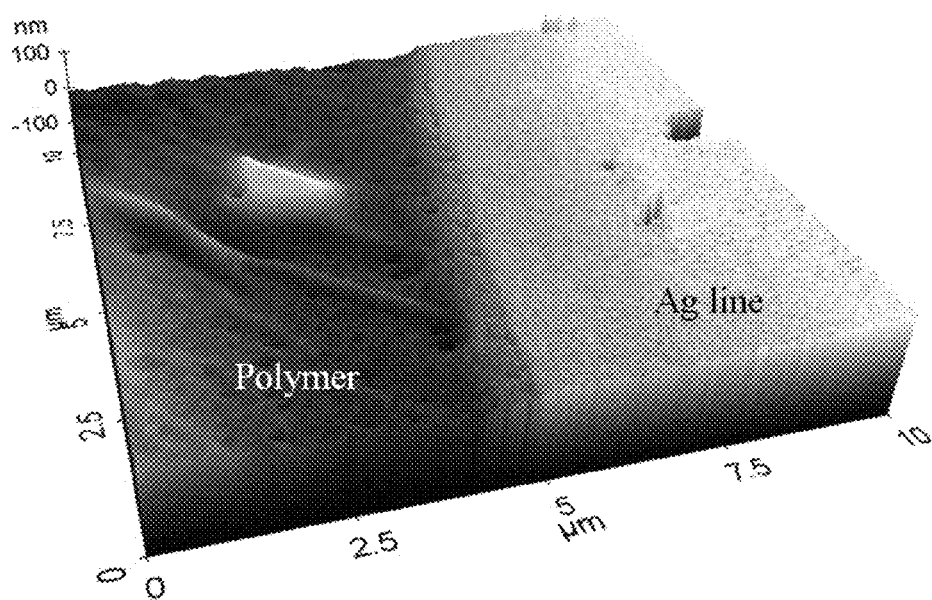
FIG. 15 is an atomic force microscope (AFM) cross-sectional photograph of a boundary of the Ag metal electrode in FIG. 14.
Figure 16A:
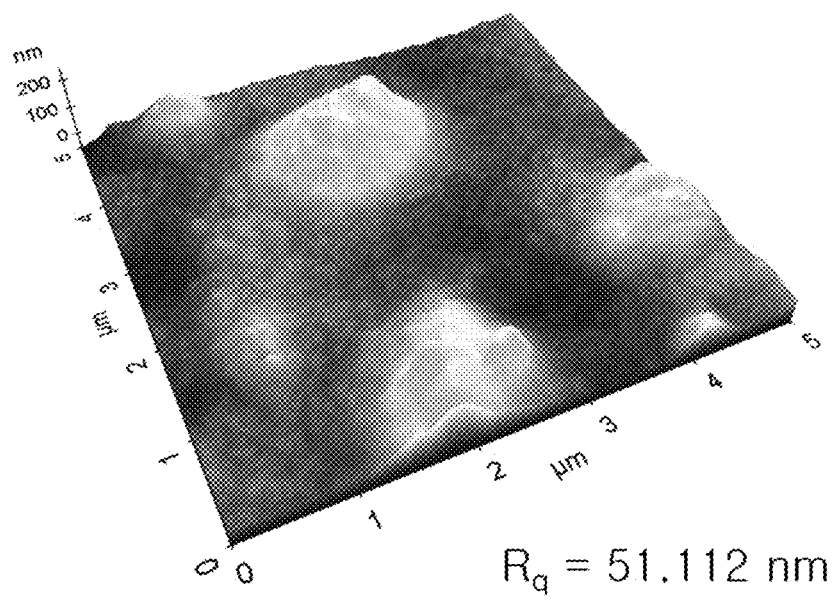
FIGS. 16A to 16B are atomic force microscope (AFM) surface photographs of a printed Ag metal electrode and an embedded Ag metal electrode by the manufacturing method according to Example 3 of the present disclosure, respectively.
Figure 16B:
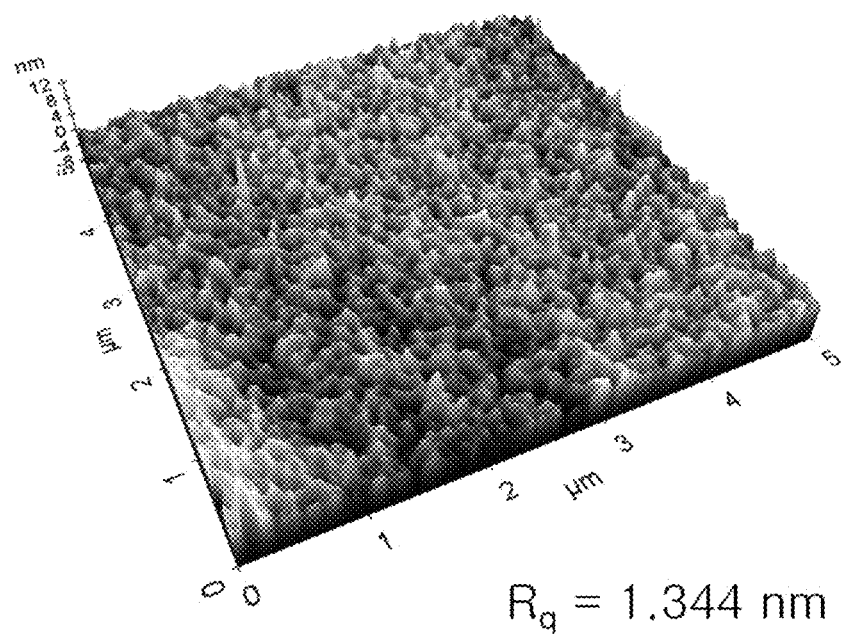

FIG. 15 is an atomic force microscope (AFM) cross-sectional photograph observing a boundary of the Ag metal electrode according to Example 3. FIGS. 16A to 16B illustrate atomic force microscope (AFM) surface photographs of the printed Ag metal electrode and the embedded Ag metal electrode according to Example 3, respectively. As such, the root-mean-squared roughness $R_q$ of the printed Ag metal electrode and the embedded Ag metal electrode was 51.112 nm and 1.344 nm, respectively.

Accordingly, in the planarizing printed electronic device according to Example 3, it may be verified that a large thickness and large surface roughness of the printed layer included in the printed electronic device may be resolved by grafting the gravure printing process, the manufacturing process of the organic material embedded layer using wet polymer, and the transferring process using the lamination device.

The wet polymer embedded layer described above contains at least one of poly-N-vinylcarbazole (PVK) which is an insulating polymer organic material, elastomers such as polyimide (PI), polycarbonate (PC), polyvinyl pyrrolidone (PVP), polyvinyl chloride (PVC), polystyrene (PS), polyfluorene (PFO), polyphenylenevinylene (PPV), epoxy (EP), polymethyl methacrylate (PMMA), polyethylene (PE), ethylene copolymers, polyvinyl alcohol (PVAL), polyhezamethylene adipamide (nylon 66), polyether sulfone (PES), polyetherether ketone (PEEK), polybutylene terephthalate (PBT), polyethylene terephthalate (PET), polypropylene (PP), propylene copolymers, poly (4-methyl-1-pentene) (TPX), polyarylate (PAR), polyacetal (POM), polyphenylene oxide (PPO), polysulfone (PSF), polyphenylene sulfide (PPS), polyvinylidene chloride (PVDC), polyvinyl acetate (PVAC), polyvinyl acetal, AS resin, ABS resin, fluorine resin, phenol resin (PF), melamine resin (MF), urea resin (UF), unsaturated polyester (UP), diallyl phthalate resin (DAP), polyurethane (PUR), polyamide (PA), silicone resin (SI) and polydimethylsiloxane (PDMS), mixtures and compounds thereof, or oligomer.

The conductive ink material includes a material formed by using a metal such as Al (4.1 to 4.3 eV), Cr (4.3 eV), Ag (4.4 eV), Cu (4.6 eV), Au (5.1 to 5.3 eV), Ni (5.2 eV), and Pt (5.7 eV), an oxide conductor such as ITO (4.8 to 5.0 eV), carbon nano tube (CNT, 4.7 to 4.9 eV), graphene (4.5 eV) which have a work function of about 4 eV to 6 eV, a conductive organic material, or a mixture thereof.

The printing process may include printing methods such as screen printing, offset, flexography, and reverse offset in addition to inkjet printing and gravure printing.

The lamination process may include glass-to-glass, glass-to-film or film-to-glass, film-to-film lamination processes.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method for manufacturing a planarized printed electronic device, comprising:
   providing a base substrate;
   performing a surface treatment on the base substrate to provide a surface treated base substrate and facilitate release during a delamination process;
   printing a layer having an electrode pattern onto the surface-treated base substrate;
   forming an organic material layer comprised of an organic material on the base substrate on which the printed layer is printed such that the printed layer is embedded therein to provide an embedded layer;
   providing a target substrate onto which the embedded layer is to be transferred;
   laminating by sandwiching the embedded layer between the base substrate on which the embedded layer is formed and the target substrate; and
   delaminating by detaching the embedded layer from the base substrate; and
   transferring the printed layer onto the target substrate to provide a planarized printed layer.

2. The method for manufacturing a planarized printed electronic device of claim 1, wherein laminating of the target substrate includes coating an adhesive for lamination on the target substrate to provide a coated target substrate, and laminating the coated target substrate with the embedded layer so that the coated target substrate is attached onto the base substrate.

3. The method for manufacturing a planarized printed electronic device of claim 2, wherein, during coating an adhesive for lamination, an adhesion state of the target substrate and the embedded layer which are attached to each other by the adhesive for lamination is controlled through an annealing process so that adhesion can be maintained even during the delamination process.

4. The method for manufacturing a planarized printed electronic device of claim 1, wherein, during laminating, pressure and heat are applied onto the target substrate by using a roller for lamination at a temperature ranging from 60° C. to 100° C.

5. The method for manufacturing a planarized printed electronic device of claim 1, wherein forming an organic material layer includes forming a polymer insulating layer by using a polymer ink including a polymer selected from the group consisting of a polyacrylate, a polyimide (PI), a polyurethane, a polyethylene, a poly(methyl methacrylate) (PMMA), a poly (vinyl phenol) (PVP), and a polyvinyl alcohol (PVA).

6. The method for manufacturing a planarized printed electronic device of claim 1, wherein printing is accomplished by any one of inkjet printing, gravure printing, screen printing, offset printing, flexography, and reverse offset printing.

* * * * *